United States Patent
Ko et al.

(10) Patent No.: US 7,468,503 B2
(45) Date of Patent: Dec. 23, 2008

(54) PIN PHOTODETECTOR WITH MINI-MESA CONTACT LAYER

(75) Inventors: Cheng C. Ko, Ann Arbor, MI (US); Barry Levine, Livingston, NJ (US)

(73) Assignee: Picometrix, LLC, Ann Arbor, MI (US)

( * ) Notice: Subject to any disclaimer, the term of this patent is extended or adjusted under 35 U.S.C. 154(b) by 209 days.

(21) Appl. No.: 10/555,144

(22) PCT Filed: Apr. 30, 2004

(86) PCT No.: PCT/US2004/013464

§ 371 (c)(1), (2), (4) Date: Oct. 31, 2005

(87) PCT Pub. No.: WO2004/100224

PCT Pub. Date: Nov. 18, 2004

(65) Prior Publication Data

US 2006/0226343 A1    Oct. 12, 2006

Related U.S. Application Data

(60) Provisional application No. 60/467,399, filed on May 2, 2003.

(51) Int. Cl.
*H01L 31/00* (2006.01)
(52) U.S. Cl. .............. 250/214.1; 257/186; 257/452; 257/458; 257/466

(58) Field of Classification Search .......... 250/214.1; 257/186, 452, 458, 466
See application file for complete search history.

(56) References Cited

U.S. PATENT DOCUMENTS

| | | | | |
|---|---|---|---|---|
| 4,885,622 A | * | 12/1989 | Uchiyama et al. | 257/53 |
| 5,448,099 A | * | 9/1995 | Yano | 257/452 |
| 5,880,489 A | * | 3/1999 | Funaba et al. | 257/184 |
| 6,635,908 B2 | * | 10/2003 | Tanaka et al. | 257/186 |
| 6,756,613 B2 | * | 6/2004 | Yuan | 257/186 |
| 6,774,448 B1 | * | 8/2004 | Lindemann et al. | 257/443 |
| 6,794,631 B2 | * | 9/2004 | Clark | 250/214.1 |
| 2005/0029541 A1 | * | 2/2005 | Ko | 257/186 |

FOREIGN PATENT DOCUMENTS

| | | | |
|---|---|---|---|
| GB | 2240874 A | * | 8/1991 |
| WO | WO 97/11494 A | | 3/1997 |
| WO | WO 01/71820 A | | 9/2001 |

* cited by examiner

*Primary Examiner*—Seung C Sohn
(74) *Attorney, Agent, or Firm*—Brinks Hofer Gilson & Lione

(57) ABSTRACT

A PIN photodetector includes a first semiconductor contact layer, a semiconductor absorption layer having a larger area than the first semiconductor contact layer, a semiconductor passivation layer positioned between the first semiconductor contact layer and absorption layer, and a second semiconductor contact layer. The semiconductor absorption layer and passivation layers are positioned between the first and second semiconductor contact layers.

26 Claims, 5 Drawing Sheets

PIN PHOTODETECTOR WITH MINI-MESA CONTACT LAYER

RELATED APPLICATION

The present application claims the benefit of U.S. Provisional Application No. 60/467,399, filed May 2, 2003, the entire contents of which are incorporated herein by reference.

BACKGROUND

The present invention generally relates to the field of photodetecton. More specifically, the invention relates to the detection of photons using a semiconductor photodetector.

Owing to the known interaction between photons and electrons, advances have been made in the field of photodetectors in recent years, particularly in those photodetectors that utilize semiconductor materials. One type of semiconductor-based photodetector known as an PIN photodetector includes a number of semiconductve materials that serve different purposes such as absorption and passivation.

With many types of PIN photodetectors, the sensitivity and reliability of photodetectors degrade over time. Further, the photodetectors experience general fatigue and wear and tear. It is, therefore, desirable to present a photodetector that maintains high responsivity, high bandwidth, and low dark current over its intended lifetime, as well as being simple to fabricate.

SUMMARY OF THE INVENTION

The present invention provides a PIN photodetector including a first semiconductor contact layer, a semiconductor absorption layer having a larger area than the first semiconductor contact layer, a semiconductor passivation layer having a larger area than the first semiconductor contact layer, and positioned between the first semiconductor contact layer and absorption layer, and a second semiconductor contact layer. The semiconductor absorption layer and passivation layers are positioned between the first and second semiconductor contact layers as in FIG. 1.

When the photodetector is in use, the electric field near the center of the semiconductor absorption layer is greater than the electric field near the edges of the semiconductor absorption layer as indicated in FIG. 2, and the capacitance of the photodiode is also determined by the area of the first small semiconductor contact layer. The photodetector may have a 3 dB bandwidth greater than 20 GHz. in certain embodiments, the photodiode has a dark current behavior that is substantially constant over long time periods (e.g. 20 years) relative to an initial value.

Embodiments of the invention may have one or more of the following advantages. The configuration has an increased lifetime and improved temperature aging characteristics. The first semiconductor contact layer defines a mini-mesa structure that is advantageous for an enhanced absorption high performance, high bandwidth PIN. Moreover, the fabrication of the mini-mesa PIN photodetector is simplified since the need for a p-diffusion step to form a localized p-contact is eliminated.

Other features and advantages will be apparent from the description and from the claims.

DETAILED DESCRIPTION

Figure 1:
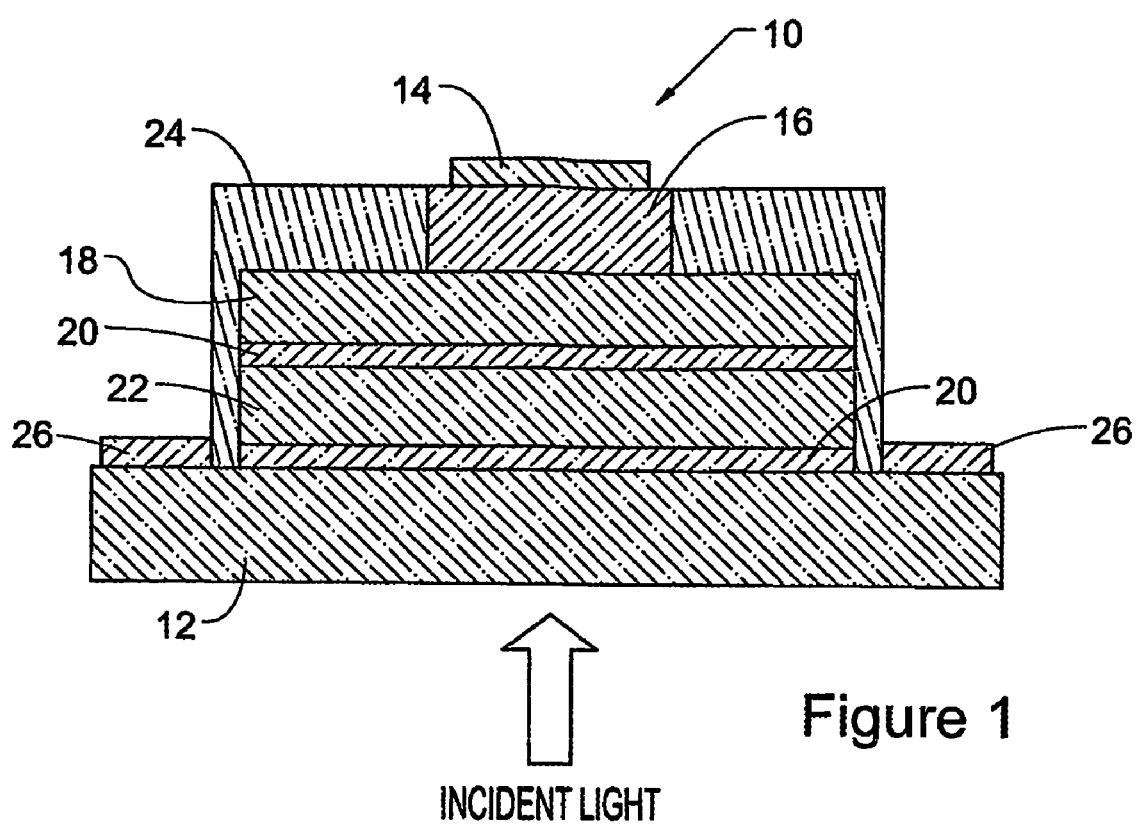
FIG. 1 is a side view of a PIN structure in accordance with an embodiment of the invention.

Referring now to the drawings, a photodetector, in particular, a mini mesa PIN photodetector embodying the principles of the present invention is illustrated therein and designated at 10. As its primary components, the PIN photodetector 10 includes an n+ contact layer 12, a p+ metal contact layer 14, and a p+ mini mesa 16. An InGaAs absorption layer 22 is disposed between the p+ mini mesa 16 and the n+ contact layer 12. A pair of bandgap grading layers 20 bound the InGaAs absorption layer 22. An nid ("not intentionally doped") passivation layer 18 is also disposed between the InGaAs absorption layer 22 and the p+ mini mesa 16. In particular embodiments, a passivation layer 24 is disposed on the outer surface of the PIN photodetector 10. The passivation layer 24 may be BCB (benzocyclobutene), silicon dioxide, silicon nitride, or polyimide. An n metal contact 26 collects electrons and is positioned on the n+contact layer 12.

Because the mini mesa 16 has a reduced area, the electric fields at the edges of the large n-mesa are substantially reduced, thus reducing the deleterious effects of any surface states or other surface defects. Furthermore, since the current is also reduced at these surfaces any charging or interface states at these boundaries is reduced.

Figure 2:
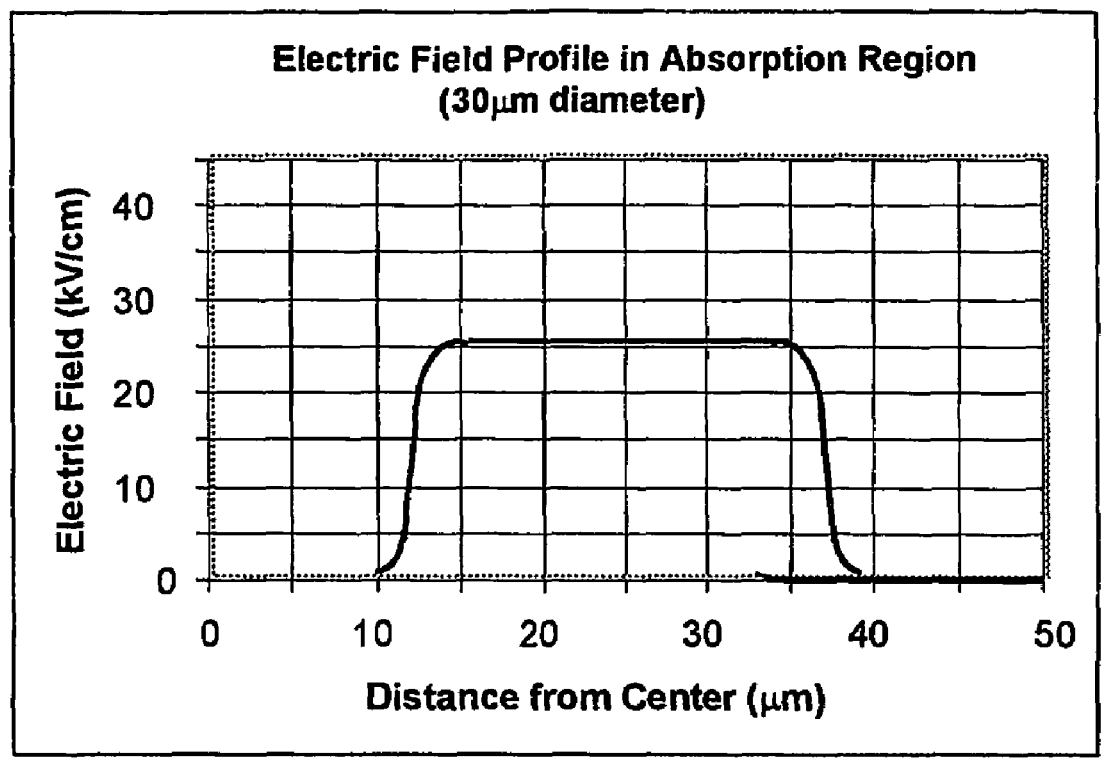
FIG. 2 is a graph showing the electric field profile across the absorption layer of the PIN structure of FIG. 1.

FIG. 2 shows schematically the electric field profile across the absorption layer 22 for a PIN photodetector with a 30 μm mini-mesa 16 and a 50 μm outer n-mesa. The field drops to near zero at the edges of the outer mesa which shows the passivation characteristics of the PIN photodetector 10.

These effects substantially increase the lifetime and improve the aging characteristics of photodetectors, such as APDs and undoped or low doped PINs, above that of the conventional mesa photodetector devices.

Figure 3:
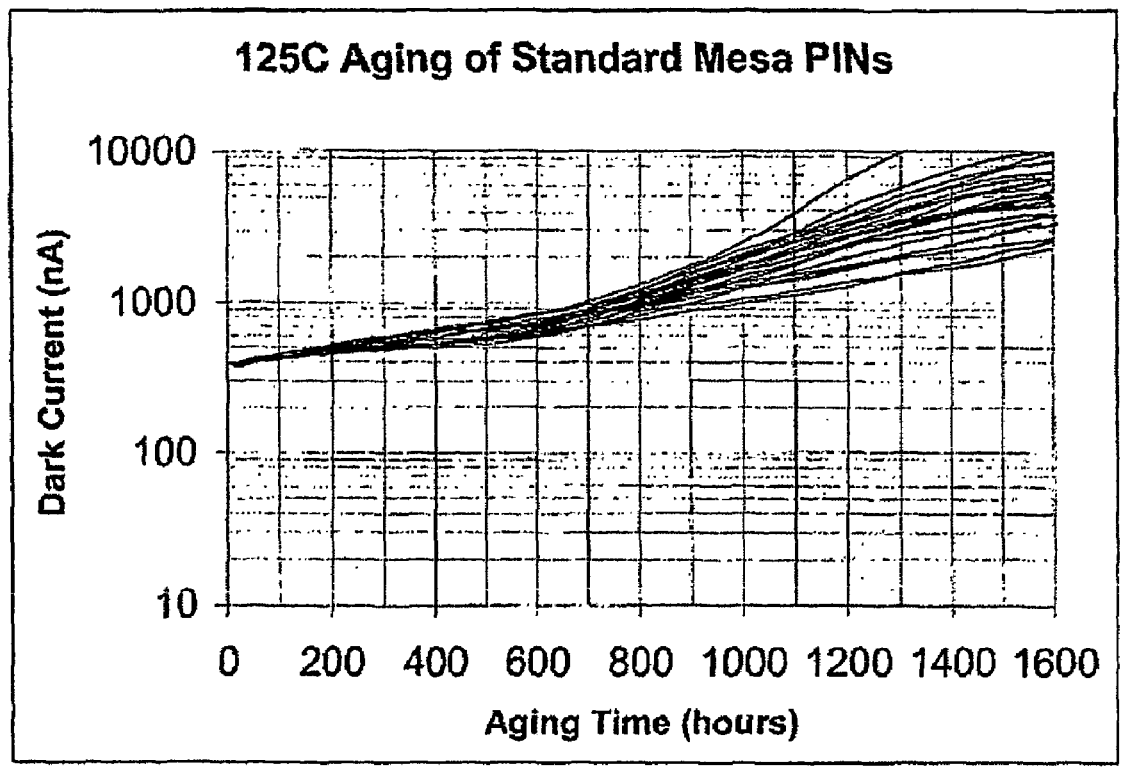
FIG. 3 is a graph showing the dark current behavior for a group of conventional mesa devices aged at 125° C. with a constant voltage bias.
Figure 4:
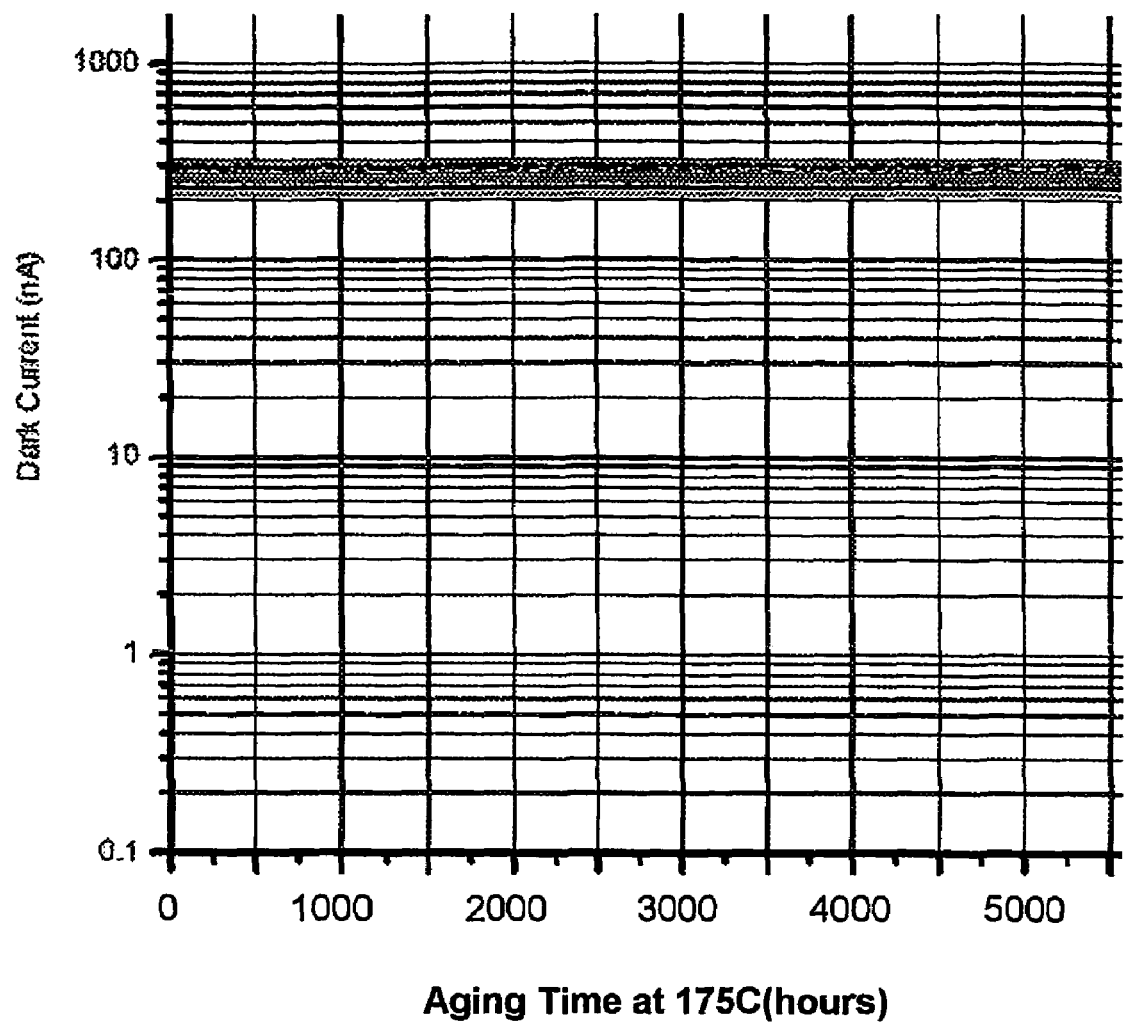
FIG. 4 s a graph showing the dark current behavior for a group of PIN structures of FIG. 1 aged at 175° C. with a constant voltage bias.

FIGS. 3 and 4 illustrate a comparison between the device aging characteristics of a conventional device (FIG. 3) and that of the PIN photodetector 10 (FIG. 4). FIG. 3 shows the dark current behavior for a group of conventional mesa devices aged at the relatively low aging temperature of 125° C. with a constant voltage bias. As shown, the dark current increases a factor of 20 times from the initial values in only 1500 hours, indicating a rapid degradation of these mesa devices.

FIG. 4, in contrast, shows the dark current behavior for a group of mini-mesa PIN photodetectors 10 aged at the much higher aging temperature of 175° C., with a constant voltage bias. As is readily seen, the dark currents for the PIN photodetectors 10 hold steady to their initial values with little or no degradation over 5000 hours. This corresponds to a lifetime that is greater than 20 years at normal operating temperatures, such as, for example, 70° C.

One of the features of the mini mesa PIN photodetector 10 is that the capacitance of the photodetector is not significantly increased because of the larger n-mesa. Consequently, the bandwidth of the PIN photodetector 10 does not differ considerably from the bandwidth of the convention mesa PINs, as experimentally verified through a series of device measurements using a Lightwave Component Analyzer.

A comparison of the measured electrical bandwidth of the mini mesa PINs and the traditional mesa PINs shows that the 3 dB bandwidth for both a 40 micron diameter mini-mesa PIN photodetector 10, and a similar sized standard mesa PIN are both about 15 GHz. Therefore, the PIN photodetector 10 has more than adequate bandwidth for OC-192 telecom applications.

Figure 5:
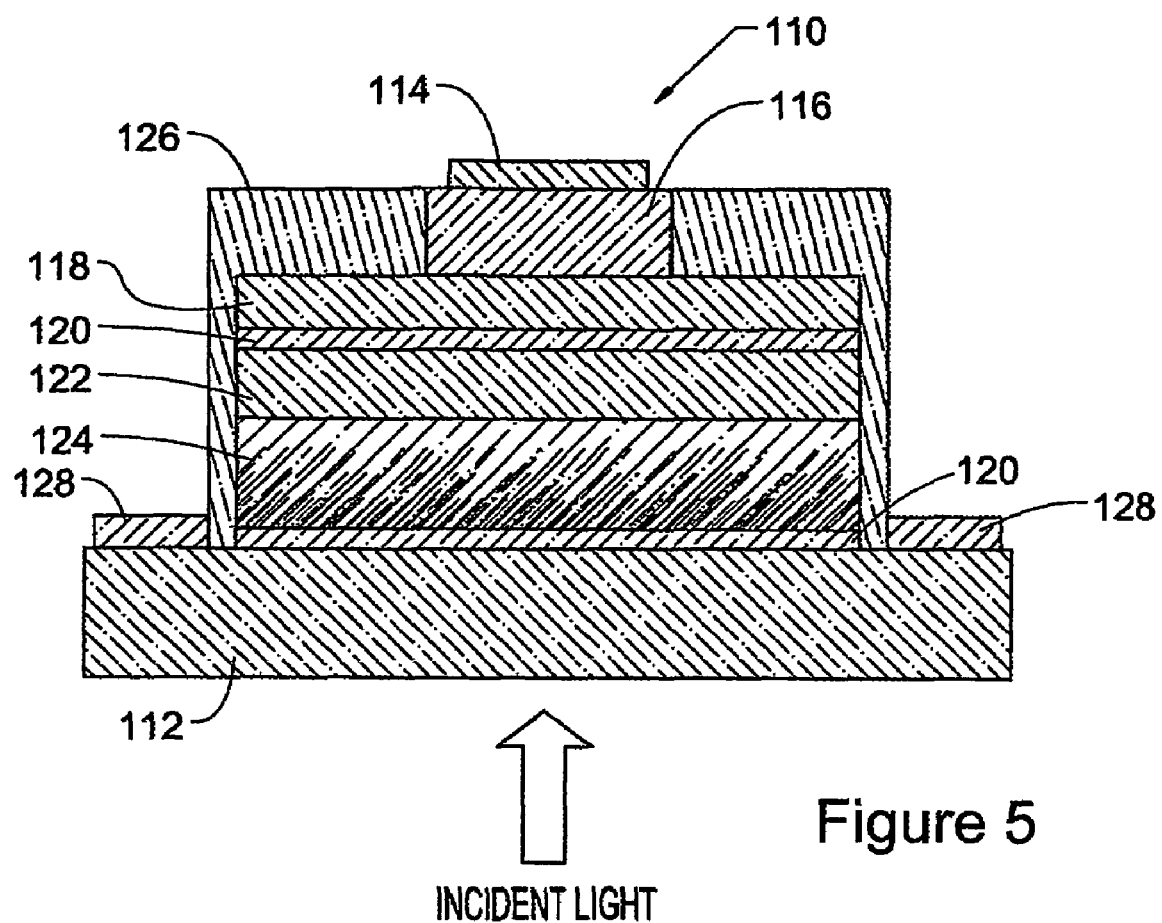
FIG. 5 is a side view of an alternative embodiment of a PIN structure in accordance with the invention.

Moreover, the mini mesa PIN photodetector 10 is particularly suitable for "enhanced" doped PINs, with graded doping concentrations which greatly increase the speed and sensitivity of high bandwidth PINs. In some implementations, the photodetector structure involves a grading of the p doping, such that the PIN structure is inverted with the p contact on the top and the n doping is on top, as illustrated as a PIN photodetector 110 in FIG. 5.

The PIN photodetector 110 includes a p+ contact 112, such as InAlAs, an n+ metal contact 114, and an n+ mini mesa 116. In certain embodiments, the n+ mini mesa 116 is InAlAs. An absorption layer 122 which may be low doped or nid InGaAs, is disposed between the n+mini mesa 116 and the p+ contact 112. A pair of bandgap graded layers 120, is disposed above and beneath the absorption layer 122. The graded p+ layer 124 is disposed between the absorption layer 122 and the p+ contact 112 such that the doping concentration of the graded p+ layer 124 increases with proximity to the p+ contacts 112. An nid passivation layer 118, preferably InAlAs, is disposed between the n+mini mesa 116 and the upper bandgap graded layer 120. A passivation 126 is disposed on the surface of the enhanced PIN 110. The passivation layer 126 may be, for example, BCB (benzocyclobutene), silicon dioxide, silicon nitride, or polymide. The p metal contact 128 is positioned on the p+ contact layer 112. This structure permits the graded p absorption layer to be as wide as the large outer contact mesa, and still have a small mini-mesa n contact to reduce capacitance and increase the bandwidth.

A simple etching process with a stop etch layer can be used to fabricate the aforementioned PIN photodetectors 10 or 110. These simple etched mini mesa structures can be reproducibly grown and fabricated, and are highly uniform over the entire wafer. The full structure is grown initially and then it is etched down to define a small localized mini mesa contact region which controls the relevant capacitance area, thus resulting in a low capacitance, high speed PIN. Thus, this design does not require a diffusion step to define the small top contact, and is therefore simpler and produces photodetectors which are more highly uniform over the entire wafer.

Note that in the PIN structures 10, 110, the high surface field near the top of the structure is very well controlled by the high bandgap passivation layers 18 and 118. As mentioned previously, these structures are high speed since the low capacitance is determined by the area of the small mini mesa diameter and not the large noncritical isolation mesa.

The above and other implementations of the principles of the invention are within the scope of the following claims.

What is claimed is:

1. A PIN photodetector comprising:
    a first semiconductor contact layer;
    a semiconductor absorption layer, the first semiconductor contact layer having a smaller area than the semiconductor absorption layer;
    a semiconductor passivation layer positioned between the first semiconductor contact layer and the semiconductor absorption layer;
    a second semiconductor contact layer, the semiconductor absorption layer and passivation layer being positioned between the first and second semiconductor contact layers;
    a first bandgap grading layer positioned between the semiconductor passivation layer and the semiconductor absorption layer and a second bandgap grading layer positioned between the semiconductor absorption layer and the second semiconductor contact layer; and
    wherein the second bandgap grading layer is directly adjacent to the second semiconductor contact layer.

2. The photodetector of claim 1 wherein the semiconductor absorption layer is InGaAs.

3. The photodetector of claim 1 wherein the passivation layer is InAlAs.

4. The photodetector of claim 1 wherein the wherein the first semiconductor contact layer is a p-type and the second semiconductor contact layer is an n-type.

5. The photodetector of claim 1 wherein the wherein the first semiconductor contact layer is an n-type and the second semiconductor contact layer is a p-type.

6. The photodetector of claim 5 wherein the first and second semiconductor contact layers are InAlAs.

7. The photodetector of claim 1 further comprising a second semiconductor passivation layer positioned about the first semiconductor passivation layer and the semiconductor absorption layer.

8. The photodetector of claim 1 further comprising a first metal contact positioned adjacent to the first semiconductor contact layer and at least one second metal contact positioned adjacent to the second semiconductor contact layer.

9. The photodetector of claim 8 wherein the first metal contact is a p-type and the second metal contact is an n-type.

10. The photodetector of claim 8 wherein the first metal contact is an n-type and the second metal contact is a p-type.

11. The photodetector of claim 1 wherein the electric field near the center of the semiconductor absorption layer is greater than the electric field near the edges of the semiconductor absorption layer.

12. The photodetector of claim 1 wherein the capacitance of the photodiode is determined by the area of the first semiconductor contact layer.

13. The photodetector of claim 1 wherein the photodiode has a dark current behavior that is substantially constant relative to an initial value.

14. The photodetector of claim 13 wherein the photodiode has a dark current behavior that is substantially constant relative to an initial value over a time period greater than 2000 hours.

15. The photodetector of claim 1 wherein the photodiode has a lifetime that exceeds twenty years.

16. The photodetector of claim 1, where other semiconductors such as InP or other binary or tertiary III-V semiconductors are used.

17. The photodetector of claim 1 wherein the second bandgap grading layer further comprises a graded p+ layer.

18. A method of fabricating a PIN photodetector comprising:
    providing a lower semiconductor contact layer;
    depositing a semiconductor absorption layer;
    depositing a semiconductor passivation layer;
    depositing or fabricating an upper semiconductor contact layer having a smaller area than the semiconductor absorption layer;
    depositing a first bandgap grading layer between the lower semiconductor contact layer and the semiconductor absorption layer and depositing a second bandgap grading layer between the semiconductor absorption layer and the semiconductor passivation layer; and wherein the first bandgap grading layer is directly adjacent to the lower semiconductor contact layer.

19. The method of claim 18 wherein the semiconductor absorption layer is InGaAs.

20. The method of claim 18 wherein the passivation layer is InAlAs.

21. The method of claim 18 wherein the wherein the lower semiconductor contact layer is an n-type and the upper semiconductor contact layer is a p-type.

22. The method of claim 18 wherein the wherein the lower semiconductor contact layer is a p-type and the upper semiconductor contact layer is an n-type.

23. The method of claim 22 wherein both semiconductor contact layers are InAlAs.

24. The method of claim 18 further comprising depositing a second semiconductor passivation layer about the first semiconductor passivation layer and the semiconductor absorption layer.

25. The method of claim 18 using other semiconductors such as InP or other binary or tertiary III-V semiconductors.

26. The method of claim 18 wherein the first bandgap grading layer further comprises a graded p+ layer.

* * * * *

UNITED STATES PATENT AND TRADEMARK OFFICE
CERTIFICATE OF CORRECTION

PATENT NO. : 7,468,503 B2  Page 1 of 1
APPLICATION NO. : 10/555144
DATED : December 23, 2008
INVENTOR(S) : Cheng C. Ko et al.

It is certified that error appears in the above-identified patent and that said Letters Patent is hereby corrected as shown below:

In the Claims

In column 4, claim 5, line 19, after "claim 1", delete "wherein the" (second occurrence).

In column 5, claim 21, line 9, after "claim 18", delete "wherein the" (second occurrence).

In column 5, claim 22, line 12, after "claim 18", delete "wherein the" (second occurrence).

Signed and Sealed this

Twelfth Day of May, 2009

JOHN DOLL
*Acting Director of the United States Patent and Trademark Office*